United States Patent [19]
Evertt et al.

[11] Patent Number: 5,880,622
[45] Date of Patent: Mar. 9, 1999

[54] METHOD AND APPARATUS FOR CONTROLLING A CHARGE PUMP FOR RAPID INITIALIZATION

[75] Inventors: Jeff Evertt, Folsom; Jahanshir J. Javanifard, Sacramento; Mase Taub, Elk Grove, all of Calif.

[73] Assignee: Intel Corporation, Santa Clara, Calif.

[21] Appl. No.: 768,297

[22] Filed: Dec. 17, 1996

[51] Int. Cl.$^6$ .............................. G05F 1/10; G05F 3/02
[52] U.S. Cl. .......................................... 327/535; 327/536
[58] Field of Search ...................... 327/534, 535, 327/536, 537, 538, 540, 541, 589, 390, 530, 544, 545, 546; 331/49, 57, 185; 365/189.09

[56] References Cited

U.S. PATENT DOCUMENTS

| | | | |
|---|---|---|---|
| 5,264,808 | 11/1993 | Tanaka | 327/534 |
| 5,319,604 | 6/1994 | Imondi et al. | 365/230.06 |
| 5,367,489 | 11/1994 | Park et al. | 327/534 |
| 5,519,360 | 5/1996 | Keeth | 327/534 |
| 5,530,640 | 6/1996 | Hara et al. | 327/534 |
| 5,532,653 | 7/1996 | Adkins | 327/534 |
| 5,539,351 | 7/1996 | Gilsdorf et al. | 327/536 |

*Primary Examiner*—My-Trang Nu Ton
*Attorney, Agent, or Firm*—Blakey, Sokoloff, Taylor & Zafman LLP

[57] ABSTRACT

A method and apparatus for controlling a charge pump. A detection circuit is used to assert a detect signal when a power supply voltage exceeds a first threshold voltage and deassert the detect signal in response to a trigger. The detect signal is used to force a charge pump to operate in a mode that drives the capacitive node at its output to the target voltage with reduced latency. This is particularly useful for a device which may operate the charge pump in a reduced power mode which is designed to maintain the node voltage at reduced power rather than drive it to the degree necessary for reduced latency during power up.

35 Claims, 5 Drawing Sheets

METHOD AND APPARATUS FOR CONTROLLING A CHARGE PUMP FOR RAPID INITIALIZATION

BACKGROUND OF THE INVENTION

1. Field of the Invention

The present invention relates to the field of integrated circuits. More particularly, the present invention relates to a method and apparatus for controlling a charge pump of an integrated circuit during power up for rapid initialization.

2. Description of Related Art

Flash electrically erasable programmable read-only memory (EEPROM) and other non-volatile memories are often used in applications, such as portable devices, in which it is particularly desirable to have reduced power consumption. It is also desirable to achieve this reduced power consumption while limiting the increase in latency of operations.

In active mode, the memory is capable of performing memory operations, such as read, program, and erase. Some non-volatile memories implement a standby mode which disables much of the circuitry of the non-volatile memory to reduce power consumption at the cost of increased latency to enter active mode.

Some non-volatile memories also implement a deep powerdown mode in which even more circuitry is disabled for even lower power consumption at the cost of longer latency to enter active mode as compared to standby mode.

During power-up, when the external power supply voltage is ramping to its steady-state voltage, the non-volatile memory may be in standby, deep powerdown or active mode depending on external control signals applied to the non-volatile memory.

Many non-volatile memories use an operating voltage higher than the externally supplied voltage for read operations. The higher operating voltage is split into a positive voltage on one node (approximately 5 volts) and a negative voltage on another node (approximately –5 volts). The first node is used as the read logic power supply and the second node is used as the local block selects power supply in a flash EPROM architecture according to well-known methods. These nodes typically have high capacitance because they are coupled to repeated structures within the memory array. The use of the charge pump to drive these large capacitive nodes to their corresponding operating voltages and maintain these voltages consumes power. The use of a negative charge pump to produce the negative voltage tends to frustrate power conservation in low power mode since negative charge pumps are less efficient than positive charge pumps in some process technologies.

Some non-volatile memories disable the positive and negative charge pumps when in standby or deep powerdown modes to reduce power consumption. These non-volatile memories use relatively expensive three-well processes such that negatively biased nodes are not required in standby or deep powerdown modes. A less expensive two-well process would require that the negatively biased nodes be maintained during standby or deep powerdown modes thereby consuming more power. If the charge pumps are operated at a level sufficient only to maintain the voltage level in the reduced power modes, the latency in returning to active mode may be unacceptably impacted.

What is needed is a method and apparatus to minimize power up time while maintaining low power consumption for non-volatile memories that use negative charge pumps in devices that require a negative voltage be maintained, such as a non-volatile memory produced using a two-well process.

SUMMARY OF THE INVENTION

A method and apparatus for controlling a charge pump is described. The apparatus employs a detection circuit to assert a detect signal when a power supply voltage exceeds a first threshold voltage and deasserts the detect signal in response to a trigger, a control logic to generate an enable signal in response to the detect signal, and a charge pump coupled to receive the enable signal and the power supply voltage, the charge pump being enabled in response to said enable signal.

Other features and advantages of the present invention will be apparent from the accompanying drawings and the detailed description that follows.

DETAILED DESCRIPTION

The present invention is a method and apparatus to control a charge pump that is controlled to operate in an active as well as low power mode; more particularly, the method and apparatus controls charge pumps in a device that requires a negative voltage be maintained. In a reduced power mode, the charge pump is partially or periodically enabled, for example, to simply maintain the negative voltage. If the charge pump is in a reduced power mode during power up, the charge pump would not be able to drive the node to the operating voltage with an acceptable latency. The present invention fully and continuously enables the charge pump during power up when the power supply voltage achieves a voltage sufficient to efficiently operate the charge pumps to achieve the operating voltage on that node with reduced latency. For example, the present invention may be employed in a non-volatile memory produced using a two-well process that requires that the negative voltage be maintained by compensating for leakage currents in the substrate. However, it will be apparent to one skilled in the art that the present invention may be applied to other devices that employ charge pumps.

In the preferred embodiment, during active mode, the negative and positive charge pumps charge the respective nodes to their operating voltages and supply the required current to the device. For example, the charge pump may be designed to provide 1–2 milliamps (mA) of current at the operating voltage to provide the power required to perform read, erase, and program operations, for example.

In one reduced power mode, referred herein as standby mode, a section of the positive charge pump is disabled such that the remaining section maintains the positive node within a range (e.g., 10 millivolts) about the positive operating voltage. A low frequency oscillator is used to periodically enable the negative charge pump to compensate for leakage of the negative node. The frequency and the duty cycle of the oscillator is selected such that the voltage at the negative node is maintained within a range (e.g., 200 millivolts) about the negative operating voltage. Since the negative charge pump operates only a fraction of the time, power consumption is reduced as compared to the continuously enabled charge pump configuration of active mode. It will be apparent to one skilled in the art that it is a matter of design choice to select the size of the enabled section of the partially enabled pump and the frequency and duty cycle of the periodically enabled pump to sufficiently maintain the operating voltage of the node.

In this embodiment, the positive node has more leakage current than the negative node because it is coupled to more diffusion and well elements within the memory array as compared to the negative node which is coupled to gates of devices within the memory array. The partially, but continuously, enabled charge pump is used on the positive node in order to compensate for the larger leakage currents as compared to the negative node. The periodically enabled charge pump is used to maintain the negative node as the leakage current is not as large. The charge pumps are not required to supply any current beyond that required to maintain the operational voltages since the device does not perform operations in this mode.

In another reduced power mode, deep powerdown mode, both the positive and negative charge pumps are periodically enabled to compensate for leakage of their respective nodes. This reduces power consumption compared to the standby mode, but may increase the latency to enter the active mode. In the preferred embodiment, the process of periodically enabling the charge pumps restore the operating voltages at the nodes from a voltage that may diverge from that operating voltage to a greater degree than the partially, but continuously, enabled charge pump. In that case, the worst case latency incurred upon entry to actual mode includes the time to restore that node to the operating voltage from the lowest voltage during each period. It will be apparent to one skilled in the art that the worst case divergence from the operating voltage is a matter of design choice for both the partially, but continuously, enabled charge pump and the periodically enabled charge pump.

When the voltage of the external power supply is ramped up during power up, the non-volatile memory may be in either the active, standby, or deep powerdown modes depending on control signals.

If the device is in a deep powerdown or standby mode during the power up process, operating the charge pumps periodically or partially enabling the charge pumps would not be sufficient to charge the capacitive nodes to their corresponding operating (target) voltages with a sufficiently small latency, if ever (this is dependent on the drive strength of the charge pump in relation to the leakage current). Preferably, the charge pumps are operated at a level sufficient only to compensate for leakage. Thus, the apparatus of the present invention executes a method for rapid initialization during power up. When the power supply voltage is ramping up, a voltage detection circuit is used to continuously and fully enable the charge pumps when that power supply voltage is at a level sufficient for the charge pumps to operate efficiently. These pumps are continuously activated for a period of time necessary to rapidly achieve the target voltages. After that period of time, the charge pumps are operated according to the current mode (i.e., deep power down, standby, or active) of the device as described above.

In other embodiments, it is contemplated that the assertion of the detect signal causes the charge pump to be partially enabled to a degree such that the latency to achieve the operating voltage is reduced to an acceptable level as compared with the reduced power modes. In still other embodiments, the assertion of the detect signal causes the charge pump to be periodically enabled with a frequency or duration such that the latency to achieve the operating voltage is reduced to an acceptable level as compared with the reduced power modes. It will be apparent to one skilled in the art that other modes of operation may be initiated by the assertion of the detect signal to reduce the latency to achieve the operating voltage.

Figure 1:
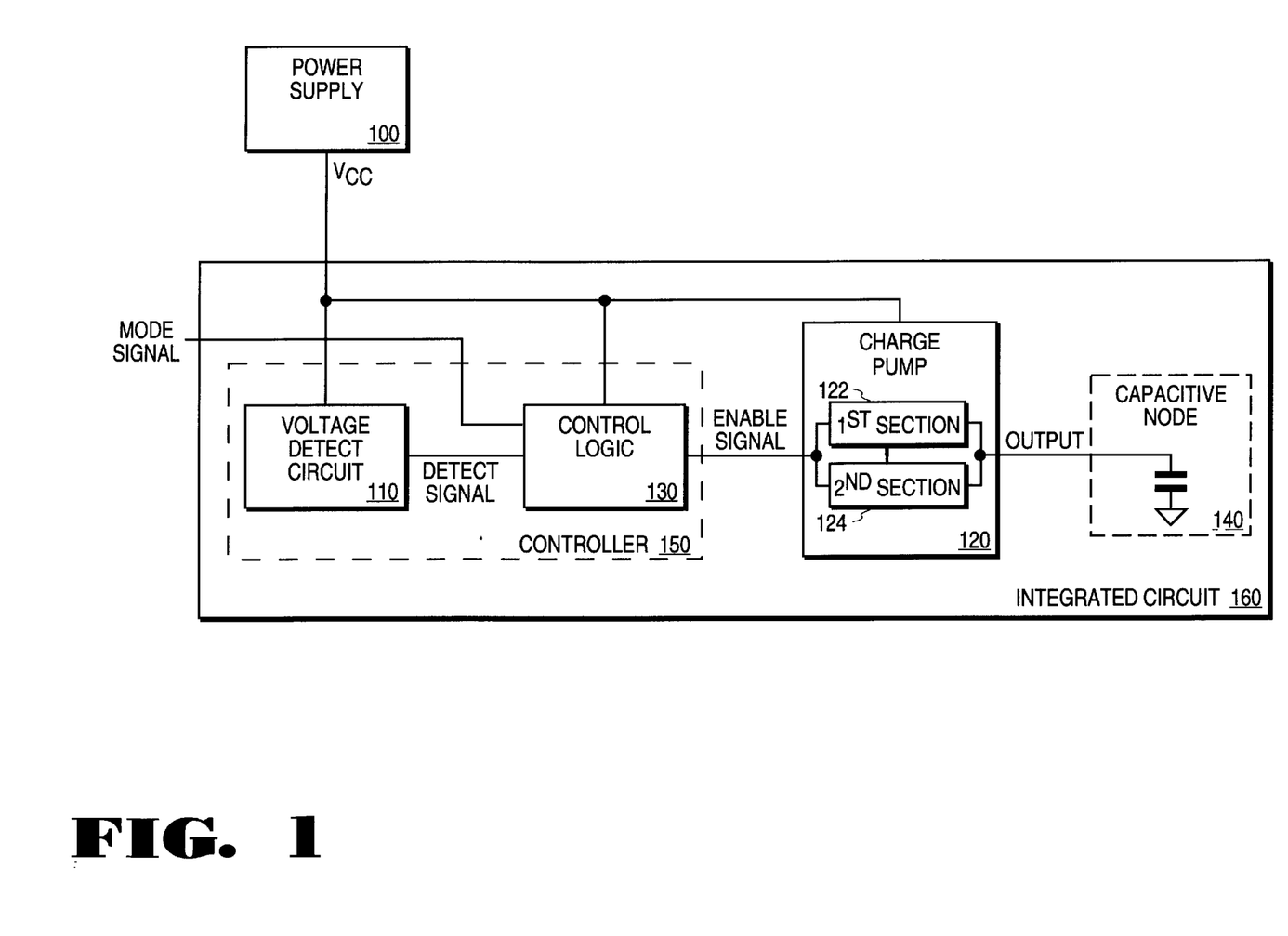
FIG. 1 illustrates one embodiment of the apparatus for controlling a charge pump for rapid initialization.

FIG. 1 illustrates one embodiment of the apparatus for controlling a charge pump during power up for rapid initialization using the method described above.

A power supply 100 is used to provide an external power-supply voltage to an integrated circuit 160. Preferably, the external power supply voltage is supplied to a charge pump 120 and a controller 150 having a voltage detect circuit 110 and a control logic 130. In alternative embodiments, some or all of these devices may be powered by another power supply. It will be apparent to one skilled in the art that some or all of the devices on the integrated circuit 160 may be implemented as discrete components. In one embodiment, the integrated circuit 160 is a non-volatile memory.

Within the integrated circuit 160, a mode signal is used to control the mode of operation of the charge pump 120 having a first section 122 and a second section 124. The charge pump 120 is a negative charge pump in the preferred embodiment. If the mode signal indicates that the non-volatile memory is in the active mode, both the first section 122 and the second section 124 of the charge pump 120 are enabled. If the mode signal indicates that the non-volatile memory is in the standby mode or in deep powerdown mode, both the first section 122 and the second section 124 of the charge pump 120 are periodically enabled to compensate for leakage. Alternatively, the charge pump 120 is a positive charge pump. If the mode signal indicates that the non-volatile memory is in the standby mode, the charge pump 120 is partially enabled by enabling the first section 122 and disabling the second section 124. If the mode signal indicates that the non-volatile memory is in deep powerdown mode, both the first section 122 and the second section 124 of the charge pump 120 are periodically enabled. It will be apparent to one skilled in the art that any number of operating characteristics may be selected for the charge pump 120 in each of the modes of operation. In the preferred embodiment, the mode signal is generated in response to external control signals provided by a processor subsystem, for example.

The voltage detect circuit 110 is coupled to receive the external power supply voltage to generate a detect signal when the power supply voltage ($V_{cc}$) exceeds a first threshold voltage. In one embodiment, the first threshold voltage is the voltage at which the logic begins to function (functional voltage). The detect signal is deasserted in response to a trigger. In one embodiment, the trigger is generated after a delay relative to the time the power supply voltage exceeds a second threshold voltage. In one embodiment, the first threshold voltage is approximately 1.0 volts, the second threshold voltage is approximately 2.3 volts and the delay is approximately 40–50 microseconds. It is readily apparent that these voltages and the delay are a matter of design choice.

The detect signal is used to enable the charge pump 120 regardless of the operating mode indicated by the mode signal. The charge pump 120 is enabled in response to the detect signal to charge a capacitive node 140 when the power supply voltage is sufficient for the charge pump 120 to operate efficiently. The delay is selected such that the charge pump 120 is operated for a period sufficient to charge the capacitive node 140 to the target voltage. Note that in this embodiment, the charge pumps are enabled prior to the external power supply voltage exceeding the second threshold voltage. Alternatively, the charge pumps are not enabled until the external power supply voltage exceeds the second threshold voltage.

The control logic 130 is coupled to receive the detect signal and the mode signal to generate an enable signal which is used to control the charge pump 120.

Preferably, the charge pump 120 is a negative charge pump and the mode signal indicates whether the integrated circuit 160 is in active (A_mode), standby (S_mode), or deep powerdown (DP_mode) mode. The control logic 130 also includes an oscillator to generate a periodic signal (P). The periodic signal is asserted at a low frequency and only for a duration necessary to compensate for leakage of the capacitive node 140. The enable signal for the negative charge pump is determined as follows:

enable=detect OR A_mode OR ([S_mode OR DP_mode] AND P)

The enable signal is asserted when the detect or active mode signals are asserted. When in deep powerdown or standby modes, the enable signal is only asserted when the periodic signal is asserted. This periodically enables both the first section 122 and the second section 124 of the charge pump 120 to maintain the capacitive node 140 at the target voltage in standby or deep powerdown modes.

Alternatively, the charge pump may be a positive charge pump. The first section 122 is enabled by the first enable signal and the second section 124 is enabled by the second enable signal. These two enable signals are generated according to the following formulas:

first enable=detect OR A_mode OR S_mode OR (DP_mode AND P)
second enable=detect OR A_mode OR (DP_mode AND P)

Both the first section 122 and the second section 124 of the charge pump are enabled when the detect or active mode signals are asserted. Similarly, the first section 122 and the second section 124 are enabled when the periodic signal is asserted in deep powerdown mode. However, when in standby mode, only the first section 122 is enabled. By using only the first section 122 of the charge pump 120 in standby mode, the capacitive node 140 is constantly maintained at the operating voltage but power consumption is reduced by disabling the second section 124 which may only be necessary to supply additional current when the integrated circuit 160 is performing an operation in active mode, for example. It will be apparent to one skilled in the art that the use of the detect signal to override the reduced power mode operation during power up may be used with other combinations of modes with different operating characteristics.

In one embodiment, the capacitive node 140 represents the power supply parasitic capacitance of the word line drivers of a memory array within the non-volatile memory. In another embodiment, the capacitive node represents the word line decoder of the memory array. It will be apparent to one skilled in the art that any number of capacitances may be included in the capacitive node 140, such as the source and/or drain capacitances of the memory array.

In one embodiment, a second charge pump is coupled to receive the mode signal, the periodic signal and the detect signal to drive a second capacitive node as described for the charge pump 120. It will be apparent to one skilled in the art that any number of positive and/or negative charge pumps may be implemented.

Preferably, the first capacitive node (first node) is driven by a positive charge pump to a target voltage of 5 volts and the second capacitive node (second node) is driven by a negative charge pump to a target voltage of −5 volts. The first node is used as the read logic power supply and the second node is used as the local block selects power supply in a flash EPROM architecture according to well-known methods. It will be apparent to one skilled in the art that the method and apparatus described herein may be employed with numerous other devices.

In one embodiment, the low frequency oscillator has a period of approximately 3 milliseconds and each pulse of the oscillating signal has a duration of approximately 5 microseconds. The positive node has a capacitance of 2000 picofarads with a leakage current of approximately 30 nanoamps and the negative node has a capacitance of 600 picofarads with a leakage current of approximately 1 nanoamp. It will be appreciated by one skilled in the art that the particular target voltage of each node, the capacitance to be charged, the first and second threshold voltages, and the duration of the detect signal, and the frequency and duty cycle of the periodic signal, for example, can vary.

In one embodiment, the detect signal is used to initiate an operation in a functional block. In one embodiment, the detect signal may be used to initialize the low frequency oscillator according to well-known methods. In another embodiment, the detect signal may be used to reset the apparatus. It will be apparent to one skilled in the art that the detect signal may be used to initiate numerous types of operations in many different types of devices.

Figure 2:
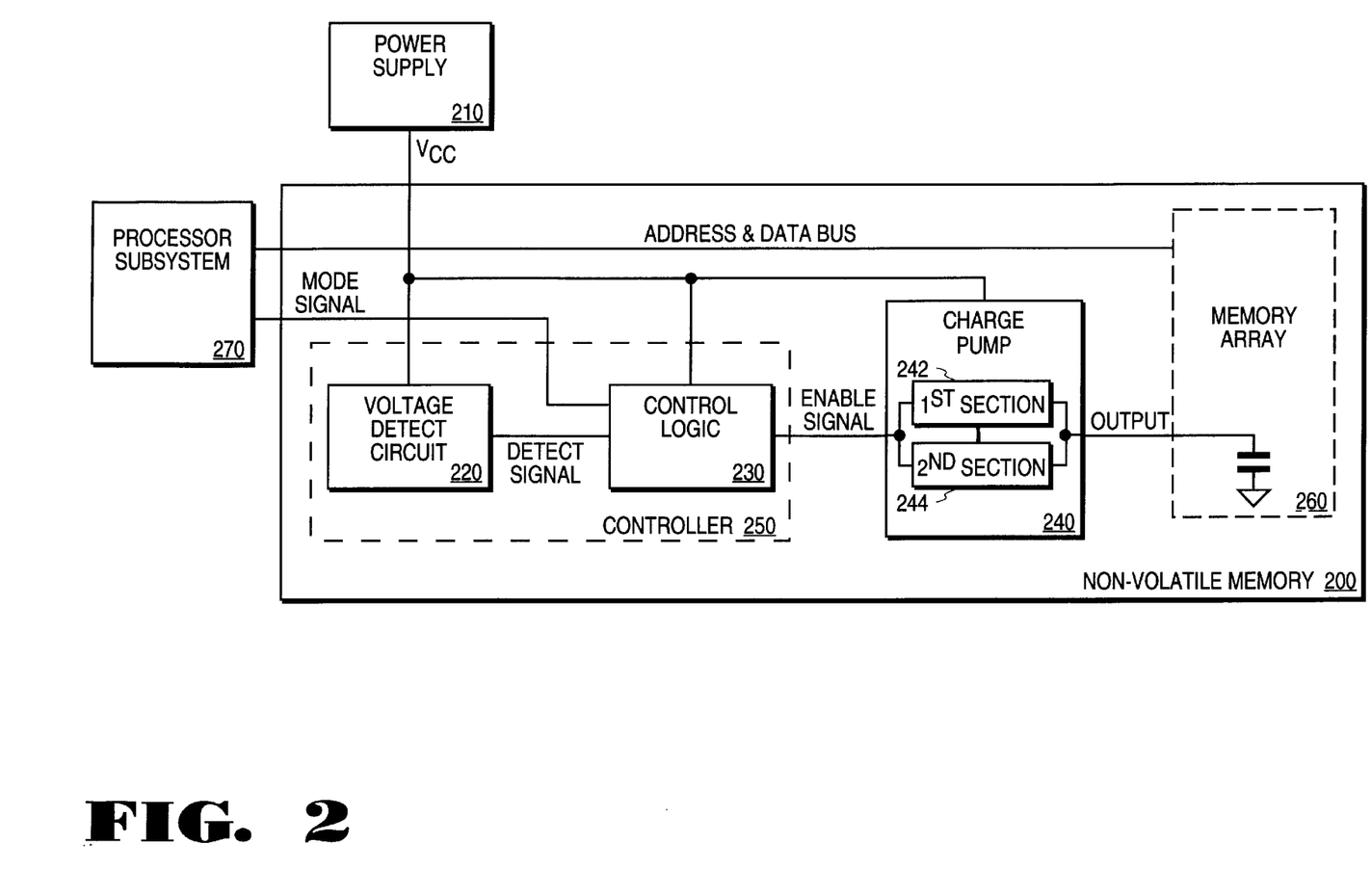
FIG. 2 illustrates one embodiment of the system for controlling a charge pump for rapid initialization.

FIG. 2 illustrates one embodiment of a system using the apparatus of FIG. 1.

Preferably, a nonvolatile memory 200 uses a configuration of a power supply 210, a controller 250 having a voltage detect circuit 220 and a control logic 230, and a charge pump 240 having a first section 242 and a second section 244 as described in FIG. 1 in which the capacitive node is a structure within a memory array 260. A processor subsystem 270 is coupled to the memory array 260 via an address and data bus to access the memory array 260. Alternatively, the apparatus of FIG. 1 may be implemented in other devices to control the charge pump 240 according to the method of the present invention. It will be apparent to one skilled in the art that the memory array 260 may include other structures.

Figure 3:
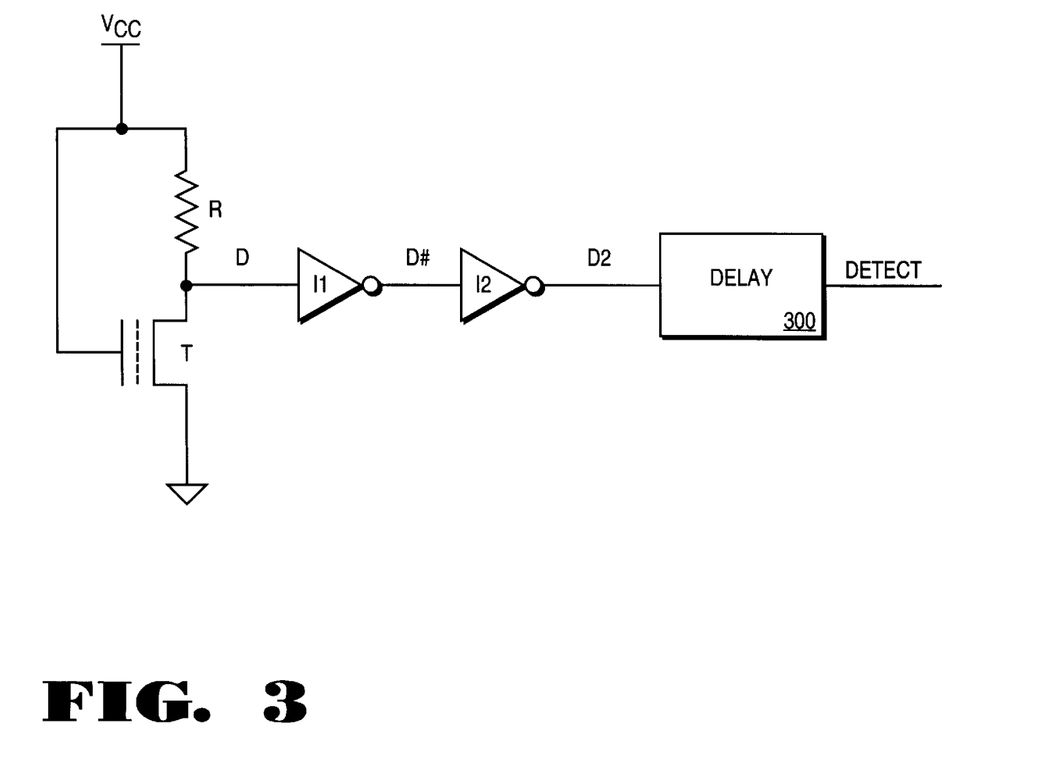
FIG. 3 illustrates one embodiment of voltage detection circuit used in the apparatus of FIG. 1.

FIG. 3 illustrates one embodiment of the voltage detect circuit 110. The voltage detect circuit 110 asserts a detect signal when the power supply voltage exceeds a first threshold voltage. In one embodiment, the first threshold voltage is the voltage at which the logic begins to function (functional voltage). The detect signal is deasserted in response to a trigger. In one embodiment, the trigger is generated after a delay relative to the time the power supply voltage exceeds a second threshold voltage. The delay is selected to be sufficient delay for the charge pump 120 to drive the capacitive node 140 to the target voltage. The second threshold voltage is selected to be a voltage at which the charge pump 120 operates efficiently.

The power supply voltage is connected through a resistor R coupled in series with a transistor T at node D. The gate of transistor T is also coupled to the power supply voltage. Node D is coupled to inverters I1 and I2 in series to produce the D2 signal. A delay circuit 300 is used to produce the detect signal which is a delayed D2 signal. Preferably, the amount of delay is substantially constant across the anticipated range of temperature variations. The circuit is configured such that as the Vcc voltage is increased, the delay is decreased and the charge pumps pump more current; therefore, the decreased delay provides sufficient time to charge the nodes to the target voltage. Other embodiments also are contemplated.

When the power supply voltage is below the first threshold voltage, the logic is non-functional. When the power supply voltage exceeds the first threshold voltage but is below the second threshold voltage, the transistor T is off and the node D2 is at the voltage of the power supply as it ramps up. The inverter I1 drives its output D# low and the inverter I2 asserts the D2 signal which is driven to the current power supply voltage level. When the power supply voltage exceeds the second threshold voltage, transistor T is on and the node D2 is driven to ground. The inverter I1 drives its output D# high and the inverter I2 drives the D2 low. After the delay, the delay circuit 300 generates a delayed version of the D2 signal. The delay is selected such that there is a sufficient time to initialize the capacitive node 140 to the target voltage. Preferably, the delay provides sufficient time to initialize the target voltage for the range of possible power supply ramps.

It will be apparent to one skilled in the art that other voltage detection circuits may be used. In an alternative embodiment, the detect signal is asserted in response to the power supply voltage exceeding a first threshold voltage and the detect signal is deasserted in response to the power supply exceeding a second threshold voltage such that the detect signal is asserted for a sufficient time to initialize the capacitive node 140 to the target voltage.

Figure 4:
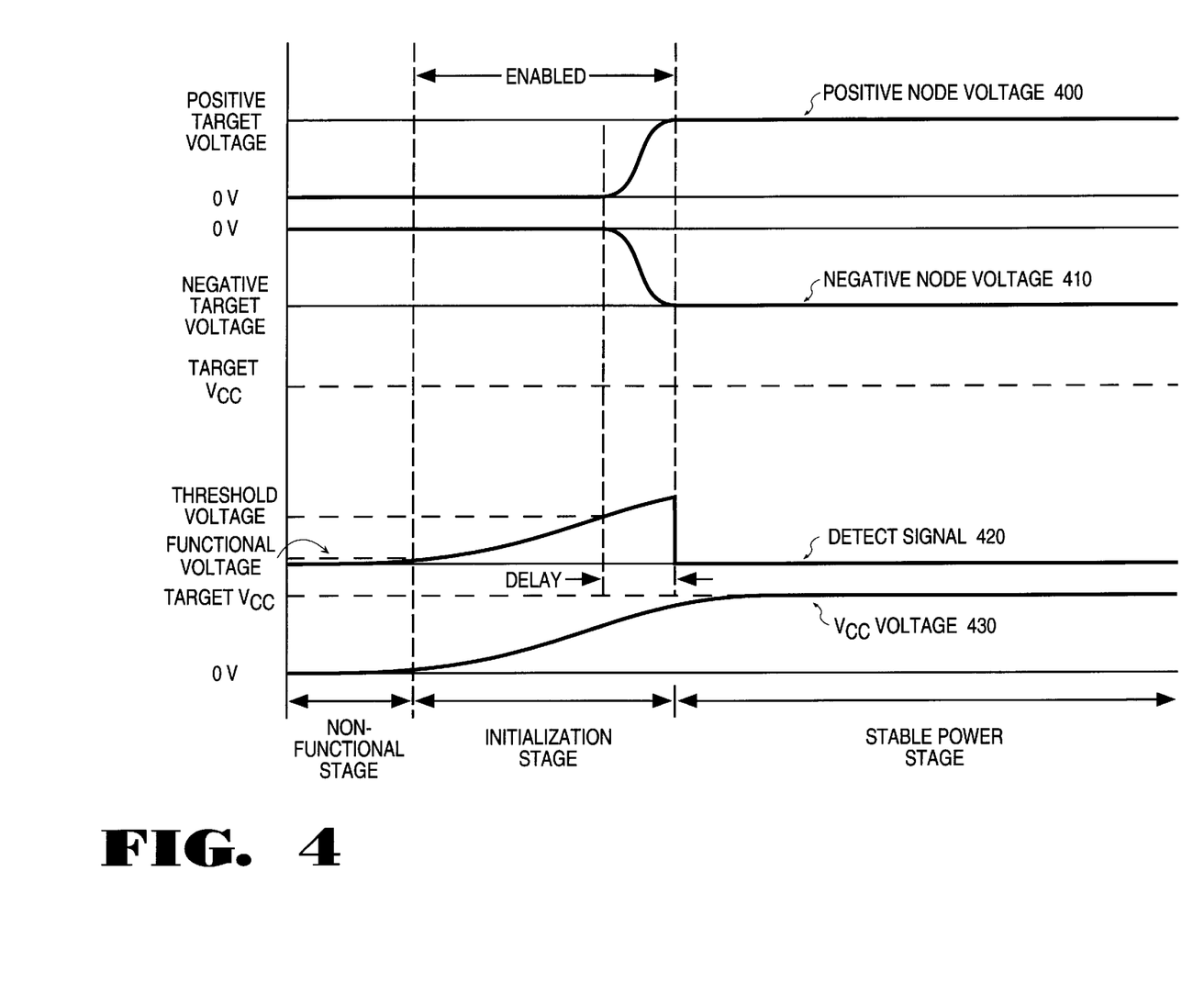
FIG. 4 illustrates a waveform diagram of one embodiment of the apparatus of FIG. 1.

FIG. 4 is a waveform diagram of one embodiment in which there is a positive charge pump charging a first node and a negative charge pump charging a second node.

A power supply voltage ($V_{cc}$) 430 is ramped up during the power up stage consisting of the non-functional stage during which the power supply voltage is below the first threshold voltage and the initialization stage during which a detect signal 420 is asserted. When the detect signal 420 is not asserted, the charge pumps operate according to the mode currently selected by the control signals. The charge pumps may be enabled, partially enabled, or periodically enabled, for example, as described above.

When the power supply voltage exceeds a first threshold (functional) voltage, the detect signal 420 is asserted. The detect signal 420 is deasserted after a sufficient delay for the charge pump to drive the nodes to their corresponding target voltages. While the detect signal 420 is asserted, the non-volatile memory is in the initialization stage and the charge pumps are continuously and fully enabled independent of the mode currently selected. In one embodiment, the delay is selected relative to the time that the power supply voltage exceeds a second threshold voltage at which the charge pumps operate efficiently. The charge pumps drive a positive node voltage 400 and a negative node voltage 410 to their corresponding target voltages relatively rapidly when the power supply voltage exceeds the second threshold voltage. It will be apparent to one skilled in the art that other modes of operation, such as one that operates the charge pumps partially or periodically to a greater degree than the reduced power mode, may be initiated by the assertion of the detect signal to reduce the latency to achieve the target voltages as described above.

After the detect signal 420 is deasserted, the part is in the stable power stage. During the stable power stage, the charge pumps operate according to the mode currently selected by the control signals. The charge pumps may be enabled, partially enabled, or periodically enabled, for example, as described above.

Figure 5:
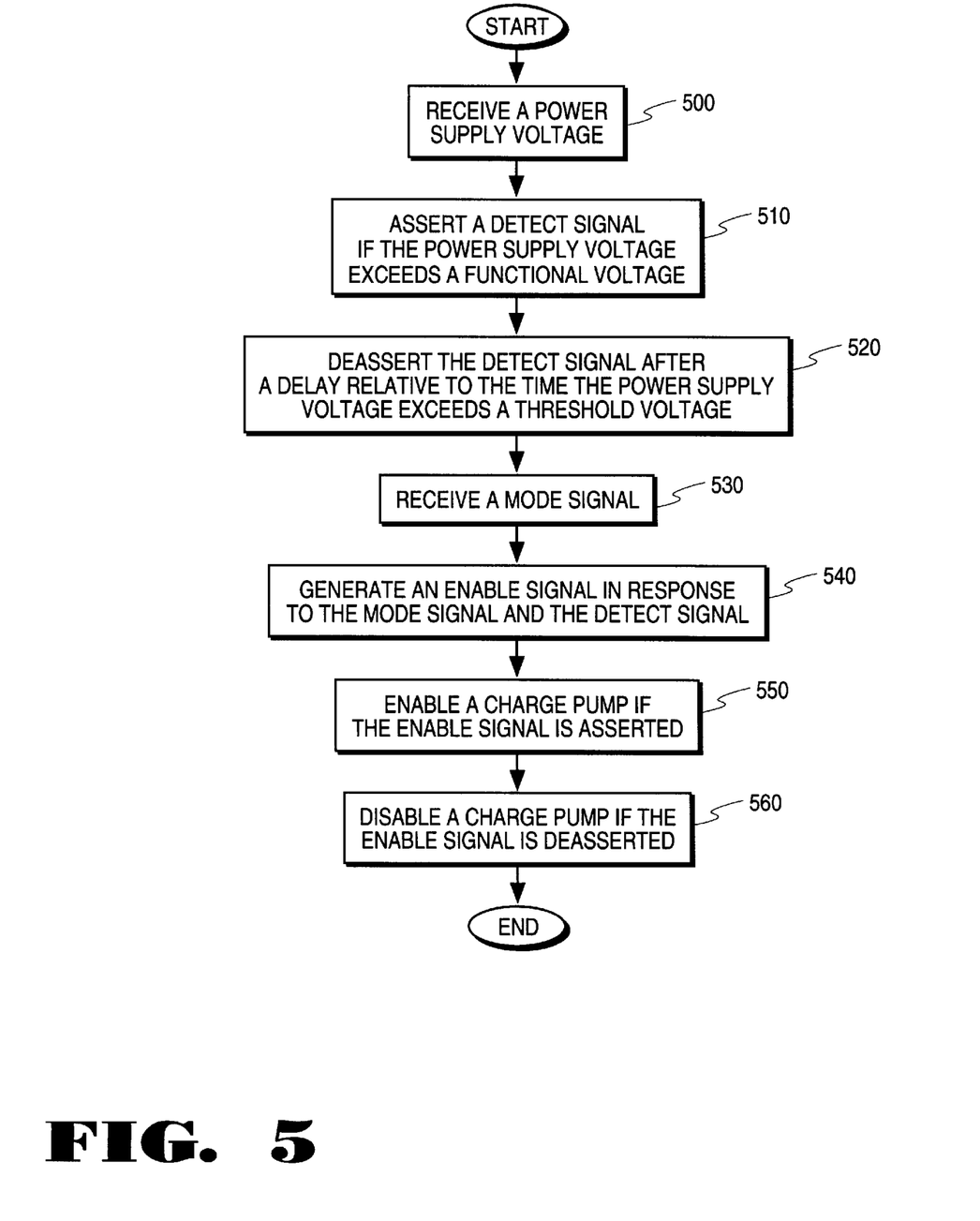
FIG. 5 illustrates a flow diagram of one embodiment of the method for controlling a charge pump for rapid initialization.

FIG. 5 illustrates one embodiment of the method.

In step 500, a power supply voltage is received. During power up, this voltage ramps up from ground to a stable steady-state voltage level.

In step 510, a detect signal is asserted in response to detecting a power supply voltage exceeding a first threshold (functional) voltage. The functional voltage is the voltage at which the logic coupled to receive the power supply voltage functions.

In step 520, a detect signal is deasserted after a certain delay relative to the time that the power supply voltage exceeds a second threshold voltage. The second threshold voltage is selected to be a voltage at which the charge pump operates efficiently. The delay is selected such that the enabled charge pump has sufficient time to charge the capacitive node to the target voltage before any memory operations (e.g., read operation) are performed.

In step 530, a mode signal is received.

In step 540, an enable signal is asserted in response to the mode signal and the detect signal.

In step 550, a charge pump is enabled if said enable signal is asserted. During the initialization stage, the detect signal is asserted to cause the charge pump to be enabled to drive the capacitive node to its target voltage with reduced latency.

In step 560, a charge pump is disabled if the enable signal is deasserted. The duration in which the charge pump is disabled should not allow the capacitive node to discharge to a voltage level at which there may be faulty operation.

What is claimed is:

1. An apparatus for controlling a charge pump, said apparatus comprising:
 a control circuit coupled to receive a power supply voltage, said control circuit asserting a detect signal in response to said power supply voltage exceeding a first threshold voltage and deasserting said detect signal after a trigger, said control circuit generating an enable signal in response to said detect signal; and
 said charge pump coupled to receive said enable signal and said power supply voltage to drive an output, said charge pump being enabled in response to said enable signal.

2. The apparatus of claim 1 wherein said control circuit is coupled to receive a mode signal, said control circuit asserting said enable signal when said detect signal is asserted, and further asserting said enable signal in response to at least one condition dependent on said mode signal.

3. The apparatus of claim 2 wherein said control circuit asserts said enable signal in response to said mode signal indicating a first mode.

4. The apparatus of claim 2 wherein said control circuit further comprises a functional block generating a signal having an asserted state and a deasserted state, said control circuit asserting said enable signal in response to said mode signal indicating a second mode and said signal being in said asserted state.

5. The apparatus of claim 4 wherein said functional block is an oscillator.

6. The apparatus of claim 2 wherein said enable signal comprises a first signal and a second signal, said charge pump comprising a first section coupled to receive said first signal and a second section coupled to receive said second signal, said first section driving said output when said first signal is asserted and said second section driving said output when said second signal is asserted, said control circuit asserting said first signal and said control circuit deasserting said second signal in response to said mode signal indicating a third mode.

7. The apparatus of claim 1 wherein said trigger occurs after a delay subsequent to the power supply voltage exceeding said first threshold voltage.

8. The apparatus of claim 7 wherein said delay is substantially constant across temperature.

9. The apparatus of claim 7 wherein said trigger occurs in response to said power supply voltage exceeding a second threshold voltage, wherein said delay corresponds to the approximate time said power supply voltage takes to ramp from first threshold voltage to said second threshold voltage.

10. The apparatus of claim 1 wherein said charge pump is a positive charge pump.

11. The apparatus of claim 1 wherein said charge pump is a negative charge pump.

12. The apparatus of claim 1 further comprising a functional block coupled to receive said detect signal, an operation being performed by said functional block in response to said detect signal.

13. The apparatus of claim 12 further wherein said functional block comprises an oscillator, said operation initializing said oscillator.

14. The apparatus of claim 1 wherein said output of said charge pump is coupled to a memory array.

15. A system for controlling a charge pump, said system comprising:

an external power supply to generate a power supply voltage;

a control circuit comprising a detect circuit coupled to receive said power supply voltage to assert a detect signal in response to said power supply voltage exceeding a first threshold voltage and deassert said detect signal after a trigger, said control circuit coupled to receive said detect signal to generate an enable signal in response to said detect signal; and said charge pump coupled to receive said enable signal and said power supply voltage to drive an output, said charge pump being enabled in response to said enable signal.

16. The system of claim 15 further comprising a controller for generating a mode signal, wherein said control circuit further comprises said control circuit coupled to receive said mode signal and said detect signal, said control circuit further asserting said enable signal when said detect signal is asserted, said control circuit asserting said enable signal in response to at least one condition dependent on said mode signal.

17. The system of claim 16 wherein said control circuit asserts said enable signal in response to said mode signal indicating a first mode.

18. The system of claim 16 wherein said control circuit further comprises a functional block generating a signal having an asserted state and a deasserted state, said control circuit asserting said enable signal in response to said mode signal indicating a second mode and said signal being in said asserted state.

19. The system of claim 18 wherein said functional block is an oscillator.

20. The system of claim 16 wherein said enable signal comprises a first signal and a second signal, said charge pump comprising a first section coupled to receive said first signal and a second section coupled to receive said second signal, said first section driving said output when said first signal is asserted and said second section driving said output when said second signal is asserted, said control circuit asserting said first signal and deasserting said second signal in response to said mode signal indicating a third mode.

21. The system of claim 15 wherein said trigger occurs after a delay subsequent to the power supply voltage exceeding said first threshold voltage.

22. The system of claim 21 wherein said delay is substantially constant across temperature.

23. The system of claim 21 wherein said detect circuit further comprises a circuit to deassert said detect signal in response to said power supply voltage exceeding a second threshold voltage, wherein said delay corresponds to the approximate time said power supply voltage takes to ramp from first threshold voltage to said second threshold voltage.

24. The system of claim 15 wherein said charge pump is a positive charge pump.

25. The system of claim 15 wherein said charge pump is a negative charge pump.

26. The system of claim 15 further comprising a functional block coupled to receive said detect signal, an operation being performed by said functional block in response to said detect signal.

27. The system of claim 26 further wherein said functional block comprises an oscillator, said operation initializing said oscillator.

28. The system of claim 15 wherein said system further comprises a memory array, said output of said charge pump being coupled to said memory array.

29. A method for controlling a charge pump, said method comprising the steps of:

receiving a power supply voltage;

asserting a detect signal in response to said power supply voltage exceeding a first threshold voltage;

deasserting said detect signal after a trigger;

generating an enable signal in response to said detect signal; and enabling said charge pump in response to said enable signal.

30. The method of claim 29 wherein the step of generating said enable signal comprises the steps of:

receiving a mode signal; and asserting said enable signal in response to said mode signal and said detect signal.

31. The method of claim 30 wherein said step of asserting said enable signal comprises the step of asserting said enable signal in response to said mode signal indicating a first mode.

32. The method of claim 30 further comprising the step of generating a periodic signal, wherein said step of asserting said enable signal comprises the step of asserting said enable signal in response to said mode signal indicating a second mode and said periodic signal being asserted.

33. The method of claim 30 wherein said step of generating said enable signal comprises the steps of generating a first enable signal and a second enable signal, said step of enabling said charge pump being responsive to said first enable signal, said method further comprising the step of enabling a second charge pump in response to said second enable signal, said first enable signal being asserted in response to said mode signal indicating a third mode, said second enable signal not being asserted in response to said mode signal indicating said third mode.

34. The method of claim 29 further comprising the step of causing an operation to be performed in response to said detect signal.

35. The method of claim 34 further wherein said operation is an initialization operation.

* * * * *